(12) United States Patent
Hasegawa et al.

(10) Patent No.: US 6,562,129 B2
(45) Date of Patent: May 13, 2003

(54) FORMATION METHOD FOR SEMICONDUCTOR LAYER

(75) Inventors: Yoshiaki Hasegawa, Osaka (JP); Ayumu Tsujimura, Osaka (JP); Isao Kidoguchi, Hyogo (JP); Yuzaburo Ban, Osaka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/837,554

(22) Filed: Apr. 19, 2001

(65) Prior Publication Data
US 2002/0102761 A1 Aug. 1, 2002

(30) Foreign Application Priority Data
Apr. 21, 2000 (JP) ........................................ 2000-120759

(51) Int. Cl.$^7$ ................................................ C30B 5/02
(52) U.S. Cl. .................... 117/105; 117/88; 117/106; 117/952
(58) Field of Search .................. 117/88, 106, 952; 438/46, 431

(56) References Cited

U.S. PATENT DOCUMENTS 5,585,305 A * 12/1996 Yamada et al. ............. 438/431
6,030,849 A * 2/2000 Hasegawa et al. ............ 438/46
6,232,623 B1 * 5/2001 Morita ........................ 257/103

FOREIGN PATENT DOCUMENTS

| JP | 05-183189 | 7/1993 |
| JP | 08-213656 | 8/1996 |
| JP | 09-298311 | 11/1997 |

OTHER PUBLICATIONS

Shuji Nakamura et al., "Hole Compensation Mechanism of P–Type GaN Films", Jpn J. Appl. Phys. vol. 31 (1992) pp. 1258–1266, Part 1, No. 5A, May 1992.

* cited by examiner

Primary Examiner—Felisa Hiteshew
(74) Attorney, Agent, or Firm—Nixon Peabody LLP; Donald R. Studebaker

(57) ABSTRACT

After a Group III–V compound semiconductor layer, to which a p-type dopant has been introduced, has been formed over a substrate, the compound semiconductor layer is annealed. In the stage of heating the compound semiconductor layer, atoms, deactivating the p-type dopant, are eliminated from the compound semiconductor layer by creating a temperature gradient in the compound semiconductor layer.

6 Claims, 6 Drawing Sheets

H2 PARTIAL PRESSURE (%) DURING POST-HEATING COOLING STEP

NUMBER OF TIMES OF ANNEALING PROCESS

FORMATION METHOD FOR SEMICONDUCTOR LAYER

BACKGROUND OF THE INVENTION

The present invention relates to a method for forming a Group III–V compound semiconductor layer, which is used for a light-emitting element that emits light in a short wavelength range covering violet to ultraviolet wavelengths.

Recently, a light-emitting element for emitting light in the short wavelength range covering the violet to ultraviolet wavelengths is in higher and higher demand as a light source for a next-generation high-density optical disk. Particularly, a Group III–V compound semiconductor layer that contains gallium nitride (GaN) as a main component has been vigorous researched and developed.

A Group III–V compound semiconductor layer, deposited by a metalorganic vapor phase epitaxy (MOVPE) process and containing gallium nitride as a main component, is supposed to have its resistance reduced by introducing a p-type dopant thereto. However, hydrogen atoms bond to the p-type dopant when the layer is passivated with hydrogen, thereby unintentionally deactivating the p-type dopant. For this reason, it is difficult to reduce the resistance of the p-type Group III–V compound semiconductor layer.

In view of this, a countermeasure process was proposed in Japanese Laid-Open Publication No. 5-183189. Specifically, in this process a p-type gallium nitride semiconductor layer is deposited on a substrate and then annealed at a temperature of 500° C. or more in an ambient containing substantially no hydrogen, thereby ejecting hydrogen from the p-type gallium nitride semiconductor layer and activating the p-type dopant. In this manner, the p-type gallium nitride semiconductor layer should have its resistance reduced.

Further, as described in Japanese Laid-Open Publication No. 5-183189, if the p-type gallium nitride semiconductor layer is annealed in this manner, the resistivity of the p-type gallium nitride semiconductor layer can be reduced to somewhere between $1 \times 10^6$ Ω·cm and several Ω·cm.

However, the present inventors were confronted with a fact that it was impossible to reduce the resistivity of the p-type gallium nitride semiconductor layer to about $1 \times 10^6$ Ω·cm to several Ω·cm as intended even if the p-type gallium nitride semiconductor layer was annealed at a temperature of 500° C. or more in an ambient containing substantially no hydrogen.

SUMMARY OF THE INVENTION

It is therefore an object of the present invention to reduce the resistance value of a p-type Group III–V compound semiconductor layer as intended.

The present inventors tried hard to find measures for achieving this object through various types of experiments. As a result, we found that if a temperature gradient is created in the compound semiconductor layer or the stress of the compound semiconductor layer is relaxed in a heating stage included in an annealing process, atoms deactivating a p-type dopant can be eliminated from the compound semiconductor layer. We also found that if the compound semiconductor layer is cooled rapidly, it is possible to prevent the atoms deactivating the p-type dopant from entering the compound semiconductor layer in a cooling stage succeeding the heating stage. The present invention was made based on these findings. More specifically, this invention is realized by the following first through third methods for forming a semiconductor layer.

A first inventive method for forming a semiconductor layer includes the steps of: forming a Group III–V compound semiconductor layer, to which a p-type dopant has been introduced, over a substrate; and annealing the compound semiconductor layer. The annealing step includes the step of eliminating atoms, deactivating the p-type dopant, from the compound semiconductor layer by creating a temperature gradient in the compound semiconductor layer in the stage of heating the compound semiconductor layer.

According to the first method, atoms, deactivating a p-type dopant, can be eliminated from a compound semiconductor layer by creating a temperature gradient in the compound semiconductor layer being heated. As a result, the resistivity of the compound semiconductor layer can be reduced as intended.

In the first method, the temperature gradient is preferably created vertically to the substrate.

Then, the atoms, deactivating the p-type dopant, can be ejected out of the compound semiconductor layer through the entire surface thereof. As a result, the resistivity of the compound semiconductor layer can be reduced as intended.

In the first method, the stage of heating the compound semiconductor layer preferably includes the step of creating the temperature gradient in the compound semiconductor layer vertically to the substrate by heating the compound semiconductor layer at an up rate greater than 0.3° C./s.

Then, an intended temperature gradient can be created in the compound semiconductor layer so that the temperature is high in a part of the compound semiconductor layer closer to the substrate and low in another part thereof closer to the surface. As a result, the atoms, deactivating the p-type dopant, can be ejected out of the compound semiconductor layer through the surface thereof as intended.

In the first method, the stage of heating the compound semiconductor layer preferably includes the step of creating the temperature gradient in the compound semiconductor layer vertically to the substrate by heating the compound semiconductor layer at an up rate greater than 10° C./s.

Then, a steep temperature gradient can be created in the compound semiconductor layer as intended so that the temperature is high in a part of the compound semiconductor layer closer to the substrate and low in another part thereof closer to the surface. As a result, the atoms, deactivating the p-type dopant, can be ejected out of the compound semiconductor layer through the surface thereof with more certainty.

In the first method, the stage of heating the compound semiconductor layer preferably includes the step of creating the temperature gradient in the compound semiconductor layer vertically to the substrate by supplying a pulsed cooling gas to the surface of the compound semiconductor layer.

Then, the temperature gradient can be created in the compound semiconductor layer so that the temperature is high in a part of the compound semiconductor layer closer to the substrate and low in another part thereof closer to the surface. As a result, the atoms, deactivating the p-type dopant, can be ejected out of the compound semiconductor layer through the surface thereof as intended.

In this case, the stage of heating the compound semiconductor layer is preferably performed in a nitrogen gas ambient and the cooling gas is preferably a hydrogen gas.

Then, by using a hydrogen gas having a thermal conductivity higher than that of a nitrogen gas in an annealing process performed normally, a temperature gradient, where the temperature is high in a part of the compound semiconductor layer closer to the substrate and low in another part thereof closer to the surface, can be created in the compound semiconductor layer as intended.

In the first method, the temperature gradient is preferably created horizontally to the substrate.

Then, the atoms, deactivating the p-type dopant, can be ejected out of the compound semiconductor layer through the surface the low-temperature part thereof. As a result, the resistivity of the compound semiconductor layer can be reduced as intended.

In the first method, the stage of heating the compound semiconductor layer preferably includes the step of creating the temperature gradient in the compound semiconductor layer horizontally to the substrate by heating the substrate on a first tray kept at a first temperature, and then placing the substrate at such a position as covering the first tray and a second tray kept at a second temperature lower than the first temperature.

Then, the temperature gradient can be created in the compound semiconductor layer horizontally to the substrate as intended.

In the first method, the stage of heating the compound semiconductor layer preferably includes the step of creating the temperature gradient in the compound semiconductor layer horizontally to the substrate by heating the substrate on a first tray kept at a first temperature, and then placing the substrate at such a position as covering the first tray, a second tray kept at a second temperature lower than the first temperature, and a third tray kept at a third temperature lower than the second temperature.

Then, the temperature gradient can be created in the compound semiconductor layer horizontally to the substrate with more certainty.

In the first method, the annealing step preferably includes the step of creating the temperature gradient in the compound semiconductor layer a number of times by heating and cooling the compound semiconductor layer multiple times.

Then, the atoms, deactivating the p-type dopant, can be ejected out of the compound semiconductor layer more efficiently. As a result, the resistivity of the compound semiconductor layer can be reduced with more certainty.

In the first method, the compound semiconductor layer preferably contains nitrogen as a Group III element.

Then, the resistivity of a Group III–V nitride semiconductor layer, which is used for a light-emitting element that emits light in a short wave-length range covering violet to ultraviolet wavelengths, can be reduced.

In this case, the compound semiconductor layer containing nitrogen is preferably a cladding, contact, or light guide layer for a light-emitting element.

Then, the operating voltage of the light-emitting element decreases, and the power dissipation can be reduced. As a result, heat generated by the light-emitting element decreases, and the reliability thereof improves.

A second inventive method for forming a semiconductor layer includes the steps of: forming a Group III–V compound semiconductor layer, to which a p-type dopant has been introduced, over a substrate; and annealing the compound semiconductor layer. The annealing step includes the step of keeping atoms, deactivating the p-type dopant, from penetrating the compound semiconductor layer by rapidly cooling the compound semiconductor layer in the stage of cooling the compound semiconductor layer after having heated the compound semiconductor layer.

According to the second method, it is possible to keep atoms, deactivating a p-type dopant, from penetrating a compound semiconductor layer in a post-heating cooling stage in an annealing step. As a result, the resistivity of the compound semiconductor layer can be reduced.

In the second method, the stage of cooling the compound semiconductor layer preferably includes the step of cooling the compound semiconductor layer at a down rate greater than 0.3° C./s.

Then, it is possible to keep the atoms, deactivating the p-type dopant, from penetrating the compound semiconductor layer in the cooling stage of the annealing step with certainty. As a result, the resistivity of the compound semiconductor layer can be reduced as intended.

In the second method, the stage of cooling the compound semiconductor layer preferably includes the step of cooling the compound semiconductor layer at a down rate greater than 10° C./s.

Then, it is possible to keep the atoms, deactivating the p-type dopant, from penetrating the compound semiconductor layer in the cooling stage of the annealing step with more certainty. As a result, the resistivity of the compound semiconductor layer can be further reduced.

In the second method, the stage of cooling the compound semiconductor layer preferably includes the step of supplying a cooling gas to the surface of the compound semiconductor layer.

Then, it is possible to keep the atoms, deactivating the p-type dopant, from penetrating the compound semiconductor layer in the cooling stage of the annealing step with more certainty. As a result, the resistivity of the compound semiconductor layer can be reduced as intended.

If the compound semiconductor layer is rapidly cooled by supplying the cooling gas to the surface of the compound semiconductor layer, the stage of cooling the compound semiconductor layer is preferably performed in a nitrogen gas ambient and the cooling gas is preferably a hydrogen gas.

Then, by using a hydrogen gas having a thermal conductivity higher than that of a nitrogen gas in an annealing process performed normally, it is possible to keep the atoms, deactivating the p-type dopant, from penetrating the compound semiconductor layer as intended.

In this case, the hydrogen gas preferably has a partial pressure of 33% or more.

Then, it is possible to keep the atoms, deactivating the p-type dopant, from penetrating the compound semiconductor layer with more certainty.

If the compound semiconductor layer is rapidly cooled by supplying the cooling gas to the surface of the compound semiconductor layer, the stage of cooling the compound semiconductor layer preferably includes the step of supplying the cooling gas when the substrate has a temperature of 500° C. or less.

Then, it is possible to keep the atoms, deactivating the p-type dopant, from penetrating the compound semiconductor layer with more certainty.

In the second method, the compound semiconductor layer preferably contains nitrogen as a Group III element.

Then, the resistivity of a Group III–V nitride semiconductor layer, which is used for a light-emitting element that emits light in a short wave-length range covering violet to ultraviolet wavelengths, can be reduced.

In this case, the compound semiconductor layer containing nitrogen is preferably a cladding, contact, or light guide layer for a light-emitting element.

Then, the operating voltage of the light-emitting element decreases, and the power dissipation can be reduced. As a result, heat generated by the light-emitting element decreases, and the reliability thereof improves.

A third inventive method for forming a semiconductor layer includes the steps of: forming a Group III–V compound semiconductor layer, to which a p-type dopant has been introduced, over a substrate; and annealing the compound semiconductor layer. The annealing step includes the step of eliminating atoms, deactivating the p-type dopant, from the compound semiconductor layer by relaxing an internal stress of the compound semiconductor layer in the stage of heating the compound semiconductor layer.

According to the third method, atoms, deactivating a p-type dopant, can be eliminated from a compound semiconductor layer by relaxing the internal stress of the compound semiconductor layer being heated. As a result, the resistivity of the compound semiconductor layer can be reduced as intended.

In the third method, the stage of heating the compound semiconductor layer preferably includes the step of relaxing the internal stress of the compound semiconductor layer by adjusting an ambient pressure on the substrate.

Then, by adjusting the pressure inside an annealing furnace in an annealing process performed normally, it is possible to keep the atoms, deactivating the p-type dopant, from penetrating the compound semiconductor layer easily and with certainty.

If the internal stress of the compound semiconductor layer is relaxed by adjusting the ambient pressure on the substrate, the stage of heating the compound semiconductor layer preferably includes the step of setting the ambient pressure higher than the atmospheric pressure.

Then, it is possible to keep the atoms, deactivating the p-type dopant, from penetrating the compound semiconductor layer with more certainty.

If the internal stress of the compound semiconductor layer is relaxed by adjusting the ambient pressure on the substrate, the stage of heating the compound semiconductor layer preferably includes the step of adjusting the ambient pressure when the substrate has a temperature of 500° C. or lower.

Then, it is possible to keep the atoms, deactivating the p-type dopant, from penetrating the compound semiconductor layer with more certainty.

In the third method, the compound semiconductor layer preferably contains nitrogen as a Group III element.

Then, the resistivity of a Group III–V nitride semiconductor layer, which is used for a light-emitting element that emits light in a short wave-length range covering violet to ultraviolet wavelengths, can be reduced.

In this case, the compound semiconductor layer containing nitrogen is preferably a cladding, contact, or light guide layer for a light-emitting element.

Then, the operating voltage of the light-emitting element decreases, and the power dissipation can be reduced. As a result, heat generated by the light-emitting element decreases, and the reliability thereof improves.

DESCRIPTION OF THE PREFERRED EMBODIMENTS

Embodiment 1

Figure 1:
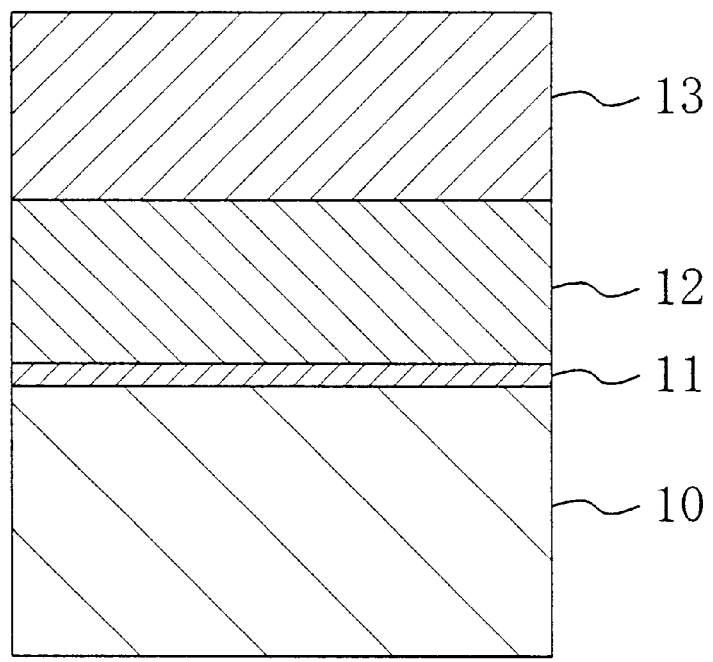
FIG. 1 is a cross-sectional view of a multiplayer structure, to which semiconductor layer forming methods according to first through sixth embodiments are applied.

Hereinafter, a semiconductor layer forming method according to a first embodiment of the present invention will be described with reference to FIGS. 1 and 2.

The first embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The first embodiment is also applicable to other Group III–V compound semiconductor layers to which a p-type dopant has been introduced.

First, after the surface of a sapphire substrate 10 has been cleaned with an acidic solution, the sapphire substrate is mounted on a susceptor in a reactor of a MOVPE apparatus (not shown), and then the reactor is evacuated. Thereafter, a hydrogen ambient with a pressure of 40 kPa is created inside the reactor, and then the temperature of the reactor is raised to about 1100° C. to heat the sapphire substrate 10, thereby thermally cleaning the surface of the sapphire substrate for about ten minutes.

Next, after the temperature of the reactor has been lowered to about 500° C., trimethylgallium (TMG) with a flow rate of 6 mL/min (in standard conditions), ammonia ($NH_3$) gas with a flow rate of 7.5 mL/min (in standard conditions), and hydrogen as a carrier gas are supplied at a time to the reactor, thereby depositing a low-temperature buffer layer 11 of GaN to a thickness of 20 nm over the sapphire substrate 10.

Then, the temperature of the reactor is raised to about 1000° C. and a GaN layer 12 having a thickness of 0.5 µm is deposited over the low-temperature buffer layer 11.

After that, trimethylaluminum (TMA) with a flow rate of 1.7 mL/min (in standard conditions) and biscyclopentadienylmagnesium (Cp$_2$ Mg: a p-type dopant) with a flow rate of 30 mL/min (in standard conditions) are additionally supplied to the reactor, thereby depositing a p-type Al$_{0.07}$Ga$_{0.93}$N layer 13 to a thickness of 0.7 µm over the GaN layer 12.

Subsequently, the sapphire substrate 10 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, the tray on which the sapphire substrate 10 is mounted is heated from room temperature (i.e., 25° C.) to 750° C. at various up rates in a range from 0.15° C. per second (0.15° C./s) to 150° C. per second (150° C./s), and then the tray has its temperature kept at 750° C. for an hour. Thereafter, the tray is cooled down to room temperature at a down rate of 10° C. per second (10° C./s). Thus, the p-type Al$_{0.07}$Ga$_{0.93}$N layer 13 is annealed. In this annealing process, the pressure inside the annealing furnace is kept at the atmospheric pressure by continuously introducing the nitrogen gas into the annealing furnace at a flow rate of 3 mL/min (in standard conditions).

When the annealing process is completed, the sapphire substrate 10 is unloaded out of the annealing furnace, and then a mask, which includes openings having a diameter of 2 mm at the four corners of a 5-mm square, is formed on the p-type Al$_{0.07}$Ga$_{0.93}$N layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type Al$_{0.07}$Ga$_{0.93}$N layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type Al$_{0.07}$Ga$_{0.93}$N layer 13. In this case, the magnesium film is provided to make an ohmic contact between the p-type Al$_{0.07}$Ga$_{0.93}$N layer 13 and gold electrodes more easily.

Subsequently, after the sapphire substrate 10 has been unloaded out of the vacuum evaporation apparatus, the sapphire substrate 10 is diced into 5-mm-square chips so that each circular electrode is located at any of the four corners of each chip. After that, hall measurement is conducted to evaluate the electrical characteristics of the p-type Al$_{0.07}$Ga$_{0.93}$N layer 13.

Figure 2:
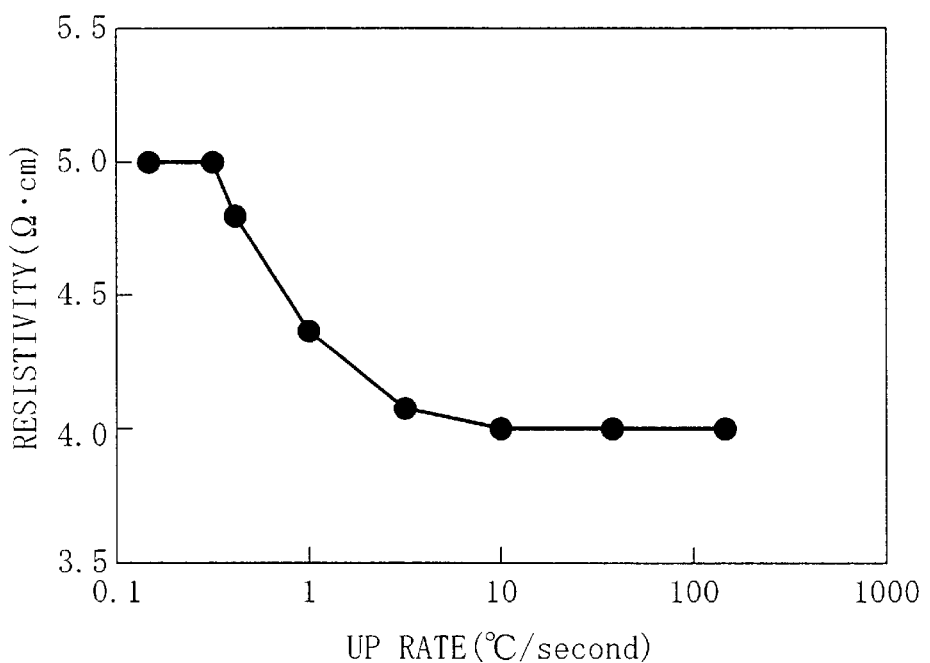
FIG. 2 is a graph showing a relationship between the up rate and the resistivity of a p-type $Al_{0.07}Ga_{0.93}N$ layer during the annealing process of the semiconductor layer forming method according to the first embodiment.

FIG. 2 shows a relationship between the up rate and the resistivity of the p-type Al$_{0.07}$Ga$_{0.93}$N layer 13 during the annealing process. As is clear from FIG. 2, the resistivity is about 5 Ω·cm if the up rate is 0.3° C./s or less. But the resistivity falls steeply once the up rate exceeds 0.3° C./s. Also, if the up rate is higher than 10° C./s, the resistivity is constant at about 4 Ω·cm. That is to say, once the up rate exceeds 10° C./s, the reduction in resistivity is saturated.

We believe that the resistivity falls steeply at the up rates of more than 0.3° C./s because of the following reasons. That is to say, since the up rate is high, a temperature difference arises between the sapphire substrate 10 and p-type Al$_{0.07}$Ga$_{0.93}$N layer 13, and thus a steep temperature gradient is created in the p-type Al$_{0.07}$Ga$_{0.93}$N layer 13 in the stacking direction (i.e., vertically to the substrate). A hydrogen atom, deactivating the p-type dopant (Mg), moves from a site of the p-type Al$_{0.07}$Ga$_{0.93}$N layer 13 where the temperature is high (i.e., a site closer to the substrate) to another site thereof where the temperature is low (i.e., a site closer to the surface). As a result, the hydrogen atom is ejected efficiently through the surface of the p-type Al$_{0.07}$Ga$_{0.93}$N layer 13.

Accordingly, if the heating step of the annealing process is performed at an up rate higher than 0.3° C./s, the hydrogen atoms, deactivating the p-type dopant, can be ejected efficiently. More particularly, if the layer is heated at an up rate higher than 10° C./s, the hydrogen atoms can be ejected even more efficiently.

This experiment was conducted on a p-type Al$_{0.07}$Ga$_{0.93}$N layer 13 with an Al mole fraction of 7%. As for a p-type Al$_x$Ga$_{1-x}$N layer (where $0.07 \leq x \leq 1$) with an Al mole fraction of more than 7%, if the layer is heated at an up rate higher than 10° C./s, the hydrogen atoms, deactivating the p-type dopant, can be ejected efficiently. Particularly when the layer is heated at an up rate of 150° C./s or higher, the hydrogen atoms can be ejected even more efficiently.

Modified Example of Embodiment 1

For the annealing process of the first embodiment, we also conducted the following experiment. After the tray on which the sapphire substrate 10 was mounted had been heated from room temperature (i.e., 25° C.) to 750° C. at an up rate of 10° C. per second (10° C./s), a pulsed hydrogen gas was introduced as a cooling gas into the surface of the p-type Al$_{0.07}$Ga$_{0.93}$N layer 13 (i.e., a step of introducing the hydrogen gas for ten seconds and another step of introducing no hydrogen gas for ten seconds were alternately repeated) during the heating step performed at a temperature of 750° C. Then, the tray was cooled down to room temperature. In this experiment, in the step of introducing no hydrogen gas, only a nitrogen gas was introduced at a flow rate of 3 L/min (in standard conditions), and in the step of introducing the hydrogen gas, a mixed gas containing a nitrogen gas and a hydrogen gas (where the partial pressure of the hydrogen gas was 33.3%) were introduced at flow rates of 2 L/min (in standard conditions) and 1 L/min (in standard conditions), respectively.

Then, a steep temperature gradient is created in the p-type Al$_{0.07}$Ga$_{0.93}$N layer 13 in the stacking direction (i.e., vertically to the substrate). As a result, a hydrogen atom, deactivating the p-type dopant (Mg), moves from a site of the p-type Al$_{0.07}$Ga$_{0.93}$N layer 13 where the temperature is high (i.e., a site closer to the substrate) to another site thereof where the temperature is low (i.e., a site closer to the surface), and thus the hydrogen atom is ejected efficiently through the surface of the p-type Al$_{0.07}$Ga$_{0.93}$N layer 13.

In the first embodiment and its modified example, the annealing process is performed just once, but alternatively, the annealing process (including the heating and cooling steps) is preferably performed a number of times. Then, the steep temperature gradients in the p-type Al$_{0.07}$Ga$_{0.93}$N layer 13 will be created in the stacking direction multiple times. As a result, the hydrogen atoms, deactivating the p-type dopant (Mg), are ejected through the surface of the p-type Al$_{0.07}$Ga$_{0.93}$N layer 13 even more efficiently.

Embodiment 2

Hereinafter, a semiconductor layer forming method according to a second embodiment of the present invention will be described with reference to FIGS. 1 and 3.

The second embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The second embodiment is also applicable to other Group III–V compound semiconductor layers to which a p-type dopant has been introduced.

First, as in the first embodiment, a p-type $Al_{0.07}Ga_{0.93}N$ layer 13 having a thickness of 0.7 μm is deposited by an MOVPE process over a sapphire substrate 10 with low-temperature buffer layer 11 and GAN layer 12 interposed therebetween.

Next, the sapphire substrate 10 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, the tray on which the sapphire substrate 10 is mounted is heated from room temperature (i.e., 25° C.) to 750° C. at an up rate of 10° C. per second (10° C./s), and then the tray has its temperature kept at 750° C. for an hour. Thereafter, the tray is cooled down to room temperature at various down rates in a range from 0.15° C. per second (0.15° C./s) to 150° C. per second (150° C./s). Thus, the p-type $Al_{0.07}Ga_{0.93}N$ layer 13 is annealed (i.e., heated and cooled). In this annealing process, the pressure inside the annealing furnace is kept at the atmospheric pressure by continuously introducing the nitrogen gas into the annealing furnace at a flow rate of 3 mL/min (in standard conditions).

When the annealing process is completed, the sapphire substrate 10 is unloaded out of the annealing furnace, and then a mask, which includes openings having a diameter of 2 mm at the four corners of a 5-mm square, is formed on the p-type $Al_{0.07}Ga_{0.93}N$ layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type $Al_{0.07}Ga_{0.93}N$ layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type $Al_{0.07}Ga_{0.93}N$ layer 13.

Subsequently, after the sapphire substrate 10 has been unloaded out of the vacuum evaporation apparatus, the sapphire substrate 10 is diced into 5-mm-square chips so that each circular electrode is located at any of the four corners of each chip. After that, hall measurement is conducted at room temperature to evaluate the electrical characteristics of the p-type $Al_{0.07}Ga_{0.93}N$ layer 13.

Figure 3:
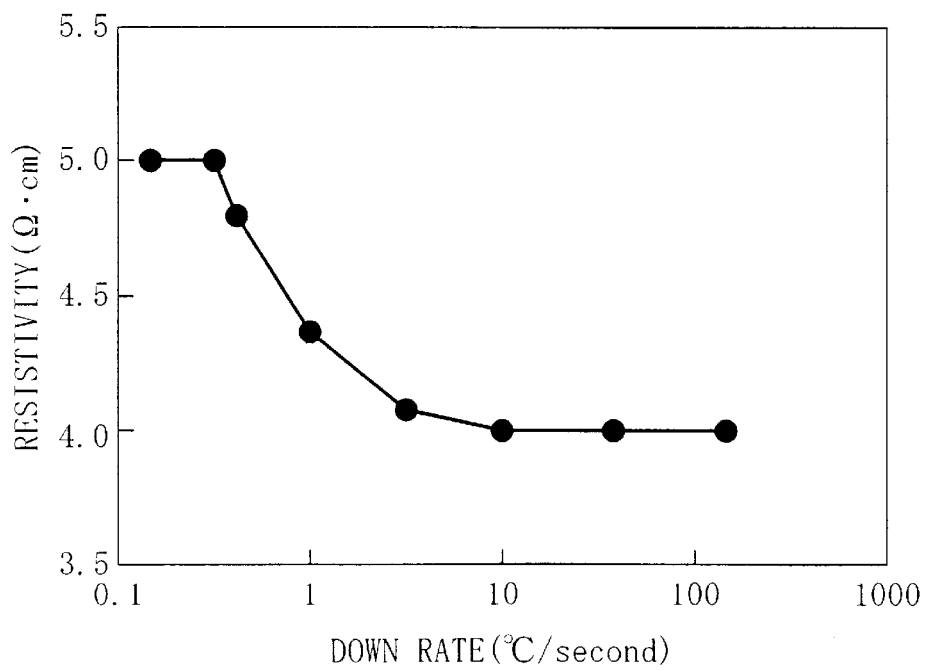
FIG. 3 is a graph showing a relationship between the down rate and the resistivity of a p-type $Al_{0.07}Ga_{0.93}N$ layer during a post-heating cooling step in the annealing process of the semiconductor layer forming method according to the second embodiment.

FIG. 3 shows a relationship between the down rate and the resistivity of the p-type $Al_{0.07}Ga_{0.93}N$ layer 13 during the cooling step succeeding the heating step in the annealing process. As is clear from FIG. 3, the resistivity is about 5 $\Omega \cdot cm$ if the down rate is 0.3° C./s or less. But the resistivity falls steeply once the down rate exceeds 0.3° C./s. Also, if the down rate is higher than 10° C./s, the resistivity is constant at about 4 $\Omega \cdot cm$. That is to say, once the down rate exceeds 10° C./s, the decrease in resistivity is saturated.

We believe that the resistivity falls steeply at the down rates of more than 0.3° C./s because of the following reasons. That is to say, since the down rate is high, the sapphire substrate 10, and eventually p-type $Al_{0.07}Ga_{0.93}N$ layer 13, are rapidly cooled down. Thus, it is possible to keep the hydrogen atoms, which deactivate the p-type dopant (Mg), from penetrating the p-type $Al_{0.07}Ga_{0.93}N$ layer 13 during the cooling step, thereby greatly reducing the resistivity of the p-type $Al_{0.07}Ga_{0.93}N$ layer 13.

Accordingly, if the post-heating cooling step of the annealing process is performed at a down rate higher than 0.3° C./s, the penetration of the hydrogen atoms, which deactivate the p-type dopant, can be suppressed. Particularly when the layer is cooled down at a down rate higher than 10° C./s, the penetration of the hydrogen atoms is still more suppressible.

This experiment was conducted on a p-type $Al_{0.07}Ga_{0.93}N$ layer 13 with an Al mole fraction of 7%. As for a p-type $Al_xGa_{1-x}N$ layer (where $0.07 < x \leq 1$) with an Al mole fraction of more than 7%, if the layer is cooled down at a down rate higher than 10° C./s, the hydrogen atoms, deactivating the p-type dopant, can be ejected efficiently. Particularly when the layer is cooled down at a down rate of 150° C./s or higher, the penetration of the hydrogen atoms can be suppressed even more effectively.

Embodiment 3

Hereinafter, a semiconductor layer forming method according to a third embodiment of the present invention will be described with reference to FIGS. 1 and 4.

The third embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The third embodiment is also applicable to other Group III–V compound semiconductor layers to which a p-type dopant has been introduced.

First, as in the first embodiment, a p-type $Al_{0.07}Ga_{0.93}N$ layer 13 having a thickness of 0.7 μm is deposited by an MOVPE process over a sapphire substrate 10 with low-temperature buffer layer 11 and GAN layer 12 interposed therebetween.

Next, the sapphire substrate 10 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, the tray on which the sapphire substrate 10 is mounted is heated from room temperature (i.e., 25° C.) to 750° C. at an up rate of 10° C. per second (10° C./s), and then the tray has its temperature kept at 750° C. for an hour. Thereafter, the tray is cooled down to room temperature, and thus the p-type $Al_{0.07}Ga_{0.93}N$ layer 13 is annealed.

As a feature of the third embodiment, in the post-heating cooling step of the annealing process, a mixed gas containing nitrogen and hydrogen gases, e.g., with flow rates of 2 and 1 L/min or 1 and 2 L/min (in standard conditions), respectively, (i.e., where the partial pressure of the hydrogen gas is 33 or 67%) is continuously introduced into the annealing furnace to keep the pressure inside the annealing furnace at the atmospheric pressure.

If the hydrogen gas is introduced into the annealing furnace in the post-heating cooling step in this manner, the surface of the p-type $Al_{0.07}Ga_{0.93}N$ layer 13 is rapidly cooled down because the thermal conductivity of the hydrogen gas is greater than that of the nitrogen gas. As a result, it is possible to keep hydrogen atoms, deactivating the p-type dopant (Mg), from penetrating the p-type $Al_{0.07}Ga_{0.93}N$ layer 13, thereby greatly reducing the resistivity of the p-type $Al_{0.07}Ga_{0.93}N$ layer 13.

When the annealing process is completed, the sapphire substrate 10 is unloaded out of the annealing furnace, and then a mask, which includes openings having a diameter of 2 mm at the four corners of a 5-mm square, is formed on the p-type $Al_{0.07}Ga_{0.93}N$ layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type $Al_{0.07}Ga_{0.93}N$ layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type $Al_{0.07}Ga_{0.93}N$ layer 13.

Subsequently, after the sapphire substrate 10 has been unloaded out of the vacuum evaporation apparatus, the sapphire substrate 10 is diced into 5-mm-square chips so that each circular electrode is located at any of the four corners of each chip. After that, hall measurement is conducted to evaluate the electrical characteristics of the p-type $Al_{0.07}Ga_{0.93}N$ layer 13.

Figure 4:
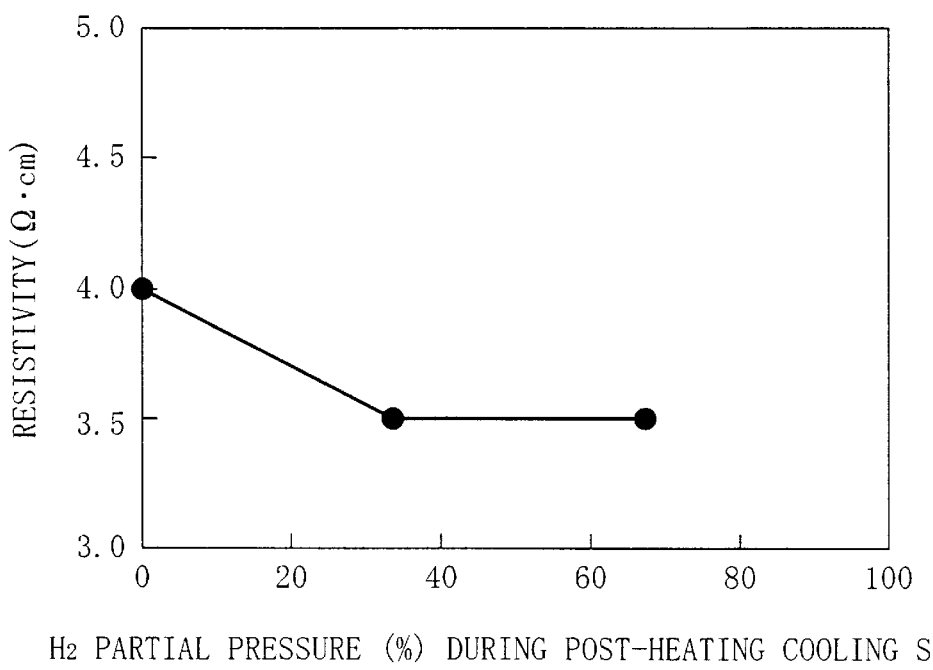
FIG. 4 is a graph showing a relationship between the partial pressure of a hydrogen gas contained in a mixed gas to be introduced into an annealing furnace and the resistivity of a p-type $Al_{0.07}Ga_{0.93}N$ layer during the post-heating cooling step in the annealing process of the semiconductor layer forming method according to the third embodiment.

FIG. 4 shows a relationship between the partial pressure of the hydrogen gas contained in the mixed gas to be introduced into the annealing furnace in the post-heating cooling step and the resistivity of the p-type $Al_{0.07}Ga_{0.93}N$ layer 13. As is clear from FIG. 4, as the partial pressure of the hydrogen gas increases, i.e., the greater the quantity of the hydrogen gas introduced, the effect of rapid cooling is promoted to reduce the resistivity. It can also be seen that if the partial pressure of the hydrogen gas is set to 33%, the resistivity, which is about 4 Ω·cm when the partial pressure of the hydrogen gas is 0%, can be reduced to about 3.5 Ω·cm. However, even if the partial pressure of the hydrogen gas is raised to 67% or more, the resistivity is constant at about 3.5 Ω·cm. And we believe that the cooling effect obtained by the introduction of the hydrogen gas is saturated.

In the post-heating cooling step, we also carried out an experiment under the following conditions: at temperatures from 750° C. to 500° C., only the nitrogen gas was introduced at a flow rate of 3 L/min (in standard conditions), but at temperatures from 500° C. to room temperature, a mixed gas containing nitrogen and hydrogen gases (where the partial pressure of the hydrogen gas was 33%) was introduced at flow rates of 2 and 1 L/min (in standard conditions), respectively. That is to say, we conducted the experiment with a cooling gas (i.e., the hydrogen gas) introduced to rapidly cool the p-type $Al_{0.07}Ga_{0.93}N$ layer 13 when the temperature of the substrate was 500° C. or lower.

We found that the p-type $Al_{0.07}Ga_{0.93}N$ layer 13 could have its resistivity reduced to about 3 Ω·cm in that case. We believe that this is because the penetration of the hydrogen atoms into the p-type $Al_{0.07}Ga_{0.93}N$ layer 13 and eventually the deactivation of the p-type dopant are still more suppressible, if the hydrogen gas is introduced at 500° C. or lower.

Embodiment 4

Hereinafter, a semiconductor layer forming method according to a fourth embodiment of the present invention will be described with reference to FIGS. 1 and 5.

The fourth embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The fourth embodiment is also applicable to other Group III–V compound semiconductor layers to which a p-type dopant has been introduced.

First, as in the first embodiment, a p-type $Al_{0.07}Ga_{0.93}N$ layer 13 having a thickness of 0.7 μm is deposited by an MOVPE process over a sapphire substrate 10 with low-temperature buffer layer 11 and GAN layer 12 interposed therebetween.

Next, the sapphire substrate 10 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, an annealing process is conducted on the sapphire substrate 10 for the first time. That is to say, the tray on which the sapphire substrate 10 is mounted is heated from room temperature (i.e., 25° C.) to 750° C. at an up rate of 10° C. per second (10° C./s), and then the tray has its temperature kept at 750° C. for an hour. Thereafter, the tray is cooled down to room temperature. In this first annealing process, the pressure inside the annealing furnace is kept at the atmospheric pressure by continuously introducing the nitrogen gas into the annealing furnace at a flow rate of 3 mL/min (in standard conditions).

Subsequently, the annealing process is conducted on the sapphire substrate 10 for the second time. That is to say, as in the first annealing process, the tray on which the sapphire substrate 10 is mounted is heated from room temperature to 750° C. at an up rate of 10° C. per second (10° C./s), and then the tray has its temperature kept at 750° C. for an hour. Thereafter, the tray is cooled down to room temperature. In this second annealing process, the pressure inside the annealing furnace is also kept at the atmospheric pressure by continuously introducing the nitrogen gas into the annealing furnace at a flow rate of 3 mL/min (in standard conditions).

After that, the same annealing process is performed repeatedly, e.g., four times, in the same way as the first and second times. That is to say, the annealing process is performed six times in total, for example.

When the annealing process has been repeated for the sixth time, the sapphire substrate 10 is unloaded out of the annealing furnace, and then a mask, which includes openings having a diameter of 2 mm at the four corners of a 5-mm square, is formed on the p-type $Al_{0.07}Ga_{0.93}N$ layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type $Al_{0.07}Ga_{0.93}N$ layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type $Al_{0.07}Ga_{0.93}N$ layer 13.

Subsequently, after the sapphire substrate 10 has been unloaded out of the vacuum evaporation apparatus, the sapphire substrate 10 is diced into 5-mm-square chips so that each circular electrode is located at any of the four corners of each chip. After that, hall measurement is conducted at room temperature to evaluate the electrical characteristics of the p-type $Al_{0.07}Ga_{0.93}N$ layer 13.

Figure 5:
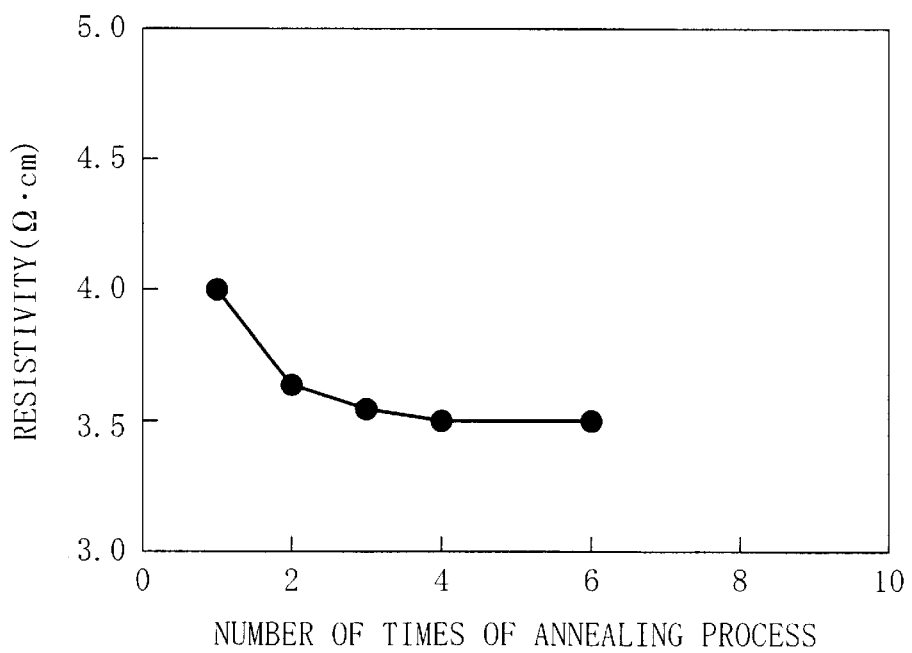
FIG. 5 is a graph showing a relationship between the number of times the annealing process is performed and the resistivity of a p-type $Al_{0.07}Ga_{0.93}N$ layer in the semiconductor layer forming method according to the fourth embodiment.

FIG. 5 shows a relationship between the number of times the annealing process is performed and the resistivity of the p-type $Al_{0.07}Ga_{0.93}N$ layer 13. As can be seen from FIG. 5, the resistivity decreases from about 4.0 Ω·cm to about 3.5 Ω·cm as the annealing process is performed a greater number of times. It can also be seen that that the decrease in resistivity is saturated on and after the number of times the annealing process is performed reaches four.

We also conducted an experiment with the tray kept at 750° C. for various lengths of time ranging from one to six hours every time the annealing process was performed. However, even if the tray was kept at the same temperature for a longer time, the resistivity did not change compared to the situation where the tray was kept at the temperature for one hour.

Accordingly, by performing the annealing process, including a rapid heating step at an up rate higher than 0.3° C./s, a number of times to create the temperature gradient in the p-type $Al_{0.07}Ga_{0.93}N$ layer 13 multiple times, the ejection of the hydrogen gas can be promoted, thus further reducing the resistivity of the p-type $Al_{0.07}Ga_{0.93}N$ layer 13.

Embodiment 5

Hereinafter, a semiconductor layer forming method according to a fifth embodiment of the present invention will be described with reference to FIGS. 1 and 6.

The fifth embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The fifth embodiment is also applicable to other Group III–V compound semiconductor layers to which a p-type dopant has been introduced.

First, as in the first embodiment, a p-type $Al_{0.07}Ga_{0.93}N$ layer 13 having a thickness of 0.7 μm is deposited by an MOVPE process over a sapphire substrate 10 with low-temperature buffer layer 11 and GAN layer 12 interposed therebetween.

Next, the sapphire substrate 10 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, the tray on which the sapphire substrate 10 is mounted is heated from room temperature (i.e., 25° C.) to 750° C. at an up rate of 10° C. per second (10° C./s), and then the tray has its temperature kept at 750° C. for an hour. Thereafter, the tray is cooled down to room temperature at a down rate of 10° C. per second (10° C./s).

As a feature of the fifth embodiment, in the heating step of the annealing process, the nitrogen gas is continuously introduced into the annealing furnace at a flow rate of 3 mL/min (in standard conditions) and a flow rate control valve, provided in a gas outlet tube for exhausting gases from inside the annealing furnace, is operated, thereby controlling the pressure inside the annealing furnace.

Then, the compressive stress created in the p-type $Al_{0.07}Ga_{0.93}N$ layer 13 is relaxed in the heating step, and thus the hydrogen atoms, deactivating the p-type dopant (Mg), are ejected out of the p-type $Al_{0.07}Ga_{0.93}N$ layer 13.

When the annealing process is completed, the sapphire substrate 10 is unloaded out of the annealing furnace, and then a mask, which includes openings having a diameter of 2 mm at the four corners of a 5-mm square, is formed on the p-type $Al_{0.07}Ga_{0.93}N$ layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type $Al_{0.07}Ga_{0.93}N$ layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type $Al_{0.07}Ga_{0.93}N$ layer 13.

Subsequently, after the sapphire substrate 10 has been unloaded out of the vacuum evaporation apparatus, the sapphire substrate 10 is diced into 5-mm-square chips so that each circular electrode is located at any of the four corners of each chip. After that, hall measurement is conducted at room temperature to evaluate the electrical characteristics of the p-type $Al_{0.07}Ga_{0.93}N$ layer 13.

Figure 6:
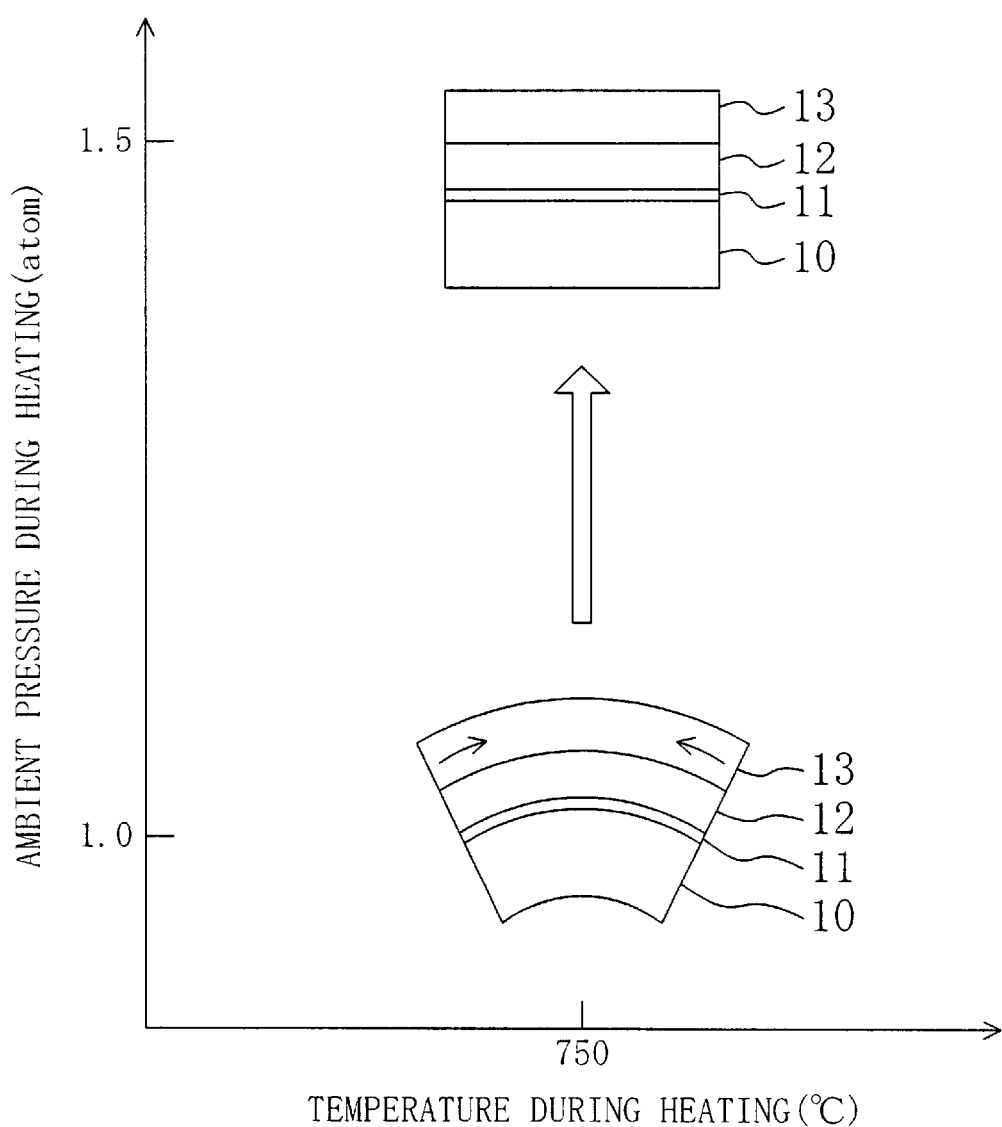
FIG. 6 illustrates cross-sectional views showing relationships between the ambient pressure during the annealing process and the cross-sectional shape of the multi-layer structure formed on a sapphire substrate in the semiconductor layer forming method according to the fifth embodiment.

FIG. 6 shows a relationship between the ambient pressure during the annealing process at a temperature of 750° C. and the cross-sectional shape of the multi-layer structure formed on the sapphire substrate 10. If the ambient pressure is higher than the atmospheric pressure, e.g., 1.5 atm. or more, the compressive stress created in the p-type $Al_{0.07}Ga_{0.93}N$ layer 13 is relaxed greatly, and thus the hydrogen atoms, deactivating the p-type dopant (Mg), are ejected out of the p-type $Al_{0.07}Ga_{0.93}N$ layer 13 efficiently. As a result, the resistivity of the p-type $Al_{0.07}Ga_{0.93}N$ layer 13 decreases.

The thermal expansion coefficient of the sapphire substrate 10 is smaller than that of the p-type $Al_{0.07}Ga_{0.93}N$ layer 13. Thus, while the sapphire substrate 10 is heated from room temperature to 750° C., compressive stress (indicated by the arrows) is created as shown in FIG. 6 in the p-type $Al_{0.07}Ga_{0.93}N$ layer 13 if the ambient pressure is 1.0 atm. But the compressive stress is relaxed when the ambient pressure reaches 1.5 atm. This stress relaxation drives the hydrogen atoms, deactivating the p-type dopant, out of the p-type $Al_{0.07}Ga_{0.93}N$ layer 13. As a result, the resistivity of the p-type $Al_{0.07}Ga_{0.93}N$ layer 13 decreases.

In this case, we confirmed that if the ambient pressure was kept at 1.0 atm., the resistivity of the p-type $Al_{0.07}Ga_{0.93}N$ layer 13 was about 4.0 Ω·cm but that if the ambient pressure was 1.5, the resistivity decreased to about 3.5 Ω·cm.

Even if the ambient pressure is set lower than the atmospheric pressure in the step of heating the sapphire substrate 10, the compressive stress created in the p-type $Al_{0.07}Ga_{0.93}N$ layer 13 is also relaxed. But if the ambient pressure is set higher than the atmospheric pressure, the stress relaxing effect is promoted, thereby reducing the resistivity greatly.

In this embodiment, the temperature during the annealing process is set to 750° C. However, we confirmed that where the ambient pressure during the heating step was set higher than the atmospheric pressure, the compressive stress created in the p-type $Al_{0.07}Ga_{0.93}N$ layer 13 could also be relaxed effectively even at an annealing temperature of 500° C. or lower at which they generally consider it hard to reduce the resistivity sufficiently.

Further, in this embodiment, since the thermal expansion coefficient of the sapphire substrate 10 is smaller than that of the p-type $Al_{0.07}Ga_{0.93}N$ layer 13, the compressive stress is created in the p-type $Al_{0.07}Ga_{0.93}N$ layer 13. But if the thermal expansion of the substrate is greater than that of the compound semiconductor layer, tensile stress is created in the compound semiconductor layer. Even so, if the ambient pressure is set higher or lower than the atmospheric pressure, the tensile strain created in the compound semiconductor layer can also be relaxed.

Embodiment 6

Hereinafter, a semiconductor layer forming method according to a sixth embodiment of the present invention will be described with reference to FIGS. 1 and 7.

The sixth embodiment mainly relates to a method for reducing the resistance of a p-type compound semiconductor layer containing gallium nitride as a main component, e.g., a p-type $Al_xGa_{1-x}N$ semiconductor layer (where $0 \leq x \leq 1$), which is used for a short-wave light-emitting element (e.g., a semiconductor laser device). The sixth embodiment is also applicable to other Group III–V compound semiconductor layers to which a p-type dopant has been introduced.

First, as in the first embodiment, a p-type $Al_{0.07}Ga_{0.93}N$ layer 13 having a thickness of 0.7 µm is deposited by an MOVPE process over a sapphire substrate 10 with low-temperature buffer layer 11 and GAN layer 12 interposed therebetween.

Next, the sapphire substrate 10, on which the multi-layer structure has been formed, is transported from the reactor of the MOVPE apparatus to an annealing furnace. Then, in the annealing furnace, in which the pressure is kept at the atmospheric pressure by introducing a nitrogen gas at a flow rate of 3 L/min (in standard conditions), the sapphire substrate 10, including the p-type $Al_{0.07}Ga_{0.93}N$ layer 13 thereon, is annealed in the following manner.

Figure 7:
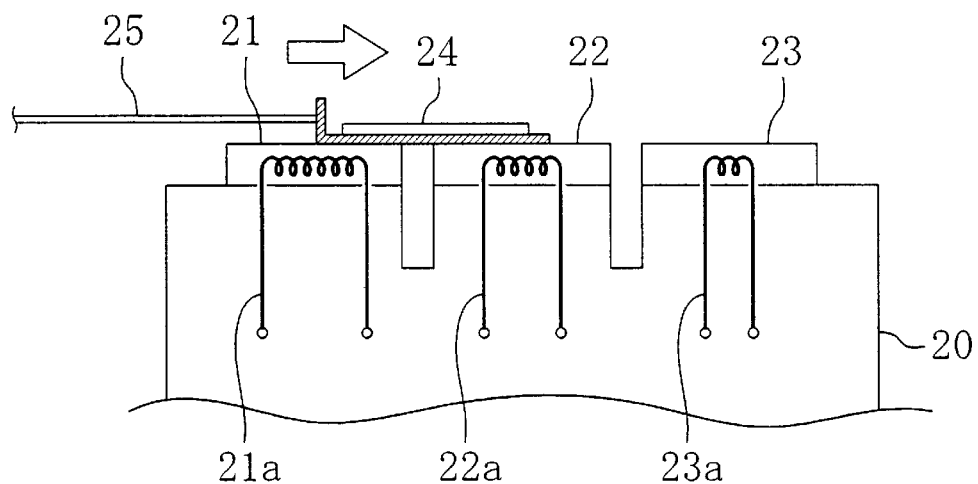
FIG. 7 is a cross-sectional view showing how to create a temperature gradient in a p-type $Al_{0.07}Ga_{0.93}N$ layer horizontally to the surface of the substrate in the semiconductor layer forming method according to the sixth embodiment.

As shown in FIG. 7, first, second, and third trays 21, 22, and 23, which are heated to, e.g., 750, 570, and 375° C. by first, second, and third heaters 21a, 22a, and 23a, respectively, are mounted on a radiator stage 20 placed in the annealing furnace. First, a substrate 24 (which herein refers to the sapphire substrate 10 having the multi-layer structure consisting of the low-temperature buffer layer 11, GAN layer 12, and p-type $Al_{0.07}Ga_{0.93}N$ layer 13 that have been stacked in this order on the sapphire substrate 10) is transported to the annealing furnace and mounted on the first tray 21. Next, the first tray 21 is heated from room temperature (i.e., 25° C.) to 750° C. at an up rate of 10° C. per second (10° C./s) and then the substrate 24 is kept heated at the temperature of 750° C. for an hour.

Next, the substrate 24 is moved horizontally using a transporter 25 and placed at such a position as covering the first and second trays 21 and 22 that have been heated to 750 and 570° C., respectively. Then, a steep temperature gradient is created in the p-type $Al_{0.07}Ga_{0.93}N$ layer 13 horizontally to the surface of the substrate. Thus, a hydrogen atom, deactivating the p-type dopant (Mg), moves from a site of the p-type $Al_{0.07}Ga_{0.93}N$ layer 13 where the temperature is high (i.e., a site closer to the first tray) to another site thereof where the temperature is low (i.e., a site closer to the second tray). Then, the hydrogen atom is ejected from the p-type $Al_{0.07}Ga_{0.93}N$ layer 13 efficiently. As a result, the resistivity of the p-type $Al_{0.07}Ga_{0.93}N$ layer 13 decreases.

When the annealing process is completed, the sapphire substrate 10 is unloaded out of the annealing furnace, and then a mask, which includes openings having a diameter of 2 mm at the four corners of a 5-mm square, is formed on the p-type $Al_{0.07}Ga_{0.93}N$ layer 13. Thereafter, the sapphire substrate 10 is transported to a vacuum evaporation apparatus.

Then, in the vacuum evaporation apparatus, a magnesium (Mg) film having a thickness of about 5 nm is deposited by a resistance heating process over the p-type $Al_{0.07}Ga_{0.93}N$ layer 13 with the mask interposed therebetween. Thereafter, gold (Au) electrodes having a thickness of about 200 nm are deposited by an electron beam (EB) process over the magnesium film, thereby forming circular electrodes (test electrodes) having a diameter of 2 mm on the p-type $Al_{0.07}Ga_{0.93}N$ layer 13.

Subsequently, after the sapphire substrate 10 has been unloaded out of the vacuum evaporation apparatus, the sapphire substrate 10 is diced into 5-mm-square chips so that each circular electrode is located at any of the four corners of each chip. After this step, we carried out hall measurement at room temperature to evaluate the electrical characteristics of the p-type $Al_{0.07}Ga_{0.93}N$ layer 13. As a result, the resistivity of the p-type $Al_{0.07}Ga_{0.93}N$ layer 13 was about 3.5 Ω·cm.

In the sixth embodiment, the substrate 20 is mounted at such a position as covering the first and second trays 21 and 22, thereby creating a temperature gradient in the p-type $Al_{0.07}Ga_{0.93}N$ layer 13 horizontally to the surface of the substrate. Alternatively, the substrate 20 may be mounted at another position covering the first, second, and third trays 21, 22, and 23 to create a temperature gradient in the p-type $Al_{0.07}Ga_{0.93}N$ layer 13 horizontally to the surface of the substrate. If the substrate 20 is mounted to cover these three trays having mutually different temperatures in this manner, an even steeper temperature gradient is created in the p-type $Al_{0.07}Ga_{0.93}N$ layer 13. As a result, the resistivity of the p-type $Al_{0.07}Ga_{0.93}N$ layer 13 further decreases.

Embodiment 7

Hereinafter, a semiconductor layer forming method according to a seventh embodiment of the present invention will be described with reference to FIGS. 8 and 9.

The seventh embodiment relates to a method for reducing the operating current of, and thereby improving the reliability of, a light-emitting element (e.g., a laser device) by reducing the resistance of a p-type compound semiconductor layer, which is used as a cladding, contact, or light guide layer for the light-emitting element.

Figure 8:
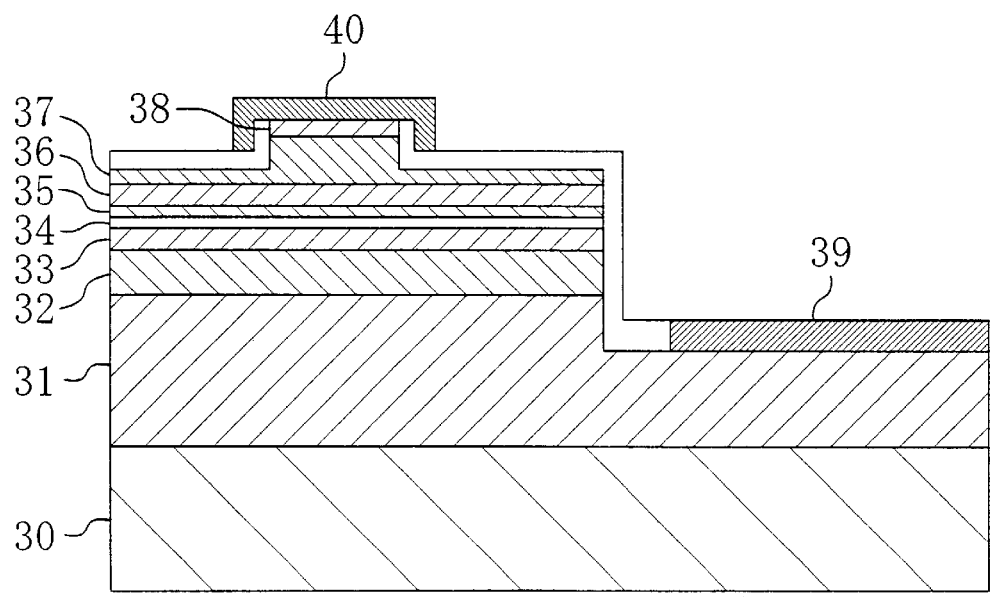
FIG. 8 is a cross-sectional view of a light-emitting element, to which the semiconductor layer forming method according to the seventh embodiment is applied.

First, as shown in FIG. 8, a sapphire substrate 30 having a diameter of, e.g., 5 cm, is mounted on a susceptor in a reactor of an MOVPE apparatus (not shown), and then the reactor is evacuated. Thereafter, a hydrogen ambient with a pressure of 40 kPa is created inside the reactor, and then the temperature of the reactor is raised to about 1100° C. to heat the sapphire substrate 20, thereby thermally cleaning the surface of the sapphire substrate 30 for about ten minutes.

Next, after the temperature of the reactor has been lowered to about 500° C., trimethylgallium (TMG) with a flow rate of 6 mL/min (in standard conditions), ammonia ($NH_3$) gas with a flow rate of 7.5 L/min (in standard conditions), and hydrogen as a carrier gas are supplied at a time to the reactor, thereby depositing a low-temperature buffer layer (not shown) of GaN to a thickness of 20 nm over the sapphire substrate 20.

Then, the temperature of the reactor is raised to about 1000° C. and a silane ($SiH_4$) gas containing an n-type dopant is supplied to the reactor, thereby depositing an n-type contact layer 31 of n-type GaN with a dopant (silicon) concentration of about $1 \times 10^{18}$ cm$^{-3}$ to a thickness of about 4 µm over the low-temperature buffer layer.

After that, trimethylaluminum (TMA) with a flow rate of 1.7 mL/min is additionally supplied to the reactor, thereby depositing an n-type cladding layer 32 of n-type $Al_{0.07}Ga_{0.93}N$ with a dopant (silicon) concentration of $5 \times 10^{17}$ cm$^{-3}$ to a thickness of about 0.7 µm over the n-type contact layer 31.

Subsequently, only the supply of trimethylaluminum (TMA) is stopped to deposit a first light guide layer 33 of n-type GaN with a dopant (silicon) concentration of about $1 \times 10^{18}$ cm$^{-3}$ to a thickness of about 100 nm over the n-type cladding layer 32.

Then, after the temperature of the reactor has been lowered to about 800° C., the hydrogen gas is replaced by an ammonia gas as a new carrier gas, and trimethylindium (TMI) and trimethylgallium (TMG) are alternately supplied to the reactor. In this manner, an active layer 34, having a multiquantum well structure made up of (three) quantum well layers of $In_{0.1}Ga_{0.9}N$ each having a thickness of about 3 nm and (two) barrier layers of GaN each having a thickness of about 9 nm, is formed on the first light guide layer 33.

Then, after the temperature of the reactor has been raised to about 1000° C. again, the nitrogen gas is replaced by a hydrogen gas as a new carrier gas, and a biscyclopentadienylmagnesium ($Cp_2Mg$) gas as a p-type dopant is supplied to the reactor along with trimethylgallium (TMG), ammonia ($NH_3$), and trimethylaluminum (TMA) gases. In this manner, a cap layer 35 of p-type $Al_{0.15}Ga_{0.85}N$ with a dopant (magnesium) concentration of $5 \times 10^{17}$ cm$^{-3}$ is deposited to a thickness of about 20 nm is deposited over the active layer 34.

After that, a second light guide layer 36 with a dopant (magnesium) concentration of $1 \times 10^{18}$ cm$^{-3}$ is deposited to a thickness of about 150 nm over the cap layer 35, and then a p-type cladding layer 37 of p-type $Al_{0.07}Ga_{0.93}N$ with a dopant (magnesium) concentration of $5 \times 10^{17}$ cm$^{-3}$ is deposited to a thickness of about 0.7 μm over the second light guide layer 36. Thereafter, a p-type contact layer 38 of p-type GaN with a dopant (magnesium) concentration of $1 \times 10^{18}$ cm$^{-3}$ is deposited to a thickness of about 0.1 μm over the p-type cladding layer 37.

Then, Group III–V compound semiconductor layers to which a p-type dopant has been introduced, e.g., the second light guide layer 36, p-type cladding layer 37, and p-type contact layer 38, are annealed. As a method for annealing these p-type Group III–V compound semiconductor layers, any of the semiconductor layer forming methods according to the first through sixth embodiments is applicable. In the following example, a situation where the fourth embodiment is applied thereto will be described.

The sapphire substrate 30 is transported from the reactor of the MOVPE apparatus to an annealing furnace and is mounted on a tray in the annealing furnace. Then, after the annealing furnace has been once evacuated, a nitrogen gas is introduced into the annealing furnace at a flow rate of 3 L/min (in standard conditions) with the pressure inside the furnace raised to the atmospheric pressure.

Then, the tray on which the sapphire substrate 30 is mounted is heated from room temperature (i.e., 25° C.) to 750° C. at an up rate of 10° C. per second (10° C./s), and then the tray has its temperature kept at 750° C. for an hour. Thereafter, the tray is cooled down to room temperature, and thus an annealing process is conducted for the first time. In this first annealing process, the pressure inside the furnace is kept at the atmospheric pressure by continuously introducing the nitrogen gas at a flow rate of 3 mL/min (in standard conditions).

Subsequently, the tray on which the sapphire substrate 30 is mounted is heated from room temperature (i.e., 25° C.) to 750° C. at an up rate of 100° C. per second (10° C./s), and then the tray has its temperature kept at 750° C. for an hour. Thereafter, the tray is cooled down to room temperature, and thus the annealing process is conducted for the second time. In this second annealing process, the pressure inside the furnace is also kept at the atmospheric pressure by continuously introducing the nitrogen gas at a flow rate of 3 mL/min (in standard conditions).

When the first and second annealing processes are over, the n-type contact layer 31 is exposed by a selective dry etching process, and then an n-side electrode 39, which is a stack of titanium and aluminum films, is formed on the n-type contact layer 31.

Then, after the p-type contact layer 38 has been patterned into a ridge shape with a ridge width of about 2 μm, a striped p-side electrode 40, which is a stack of nickel and gold films, is formed on the p-type contact layer 38. In this case, the n- and p-side electrodes 39 and 40 are insulated from each other by an insulating film 41 of silicon dioxide ($SiO_2$).

After that, a light-emitting element (e.g., a semiconductor laser device) having a resonant cavity length of 750 μm is formed by cleaving the multi-layer structure, and then a high-reflectance coating layer of silicon dioxide and titanium dioxide ($TiO_2$) with a reflectance of 90% is formed on one of the cleaved facets of the resonant cavity. In this manner, the light-emitting element (e.g., a semiconductor laser device) is obtained.

According to the seventh embodiment, the Group III–V compound semiconductor layers to which a p-type dopant has been introduced, e.g., the second light guide layer 36, p-type cladding layer 37, and p-type contact layer 38, are annealed twice. Accordingly, atoms, deactivating the dopant in the second light guide layer 36, p-type cladding layer 37, and p-type contact layer 38, can be eliminated, thus reducing the resistivity of these compound semiconductor layers as intended.

We measured the laser device characteristics of the light-emitting element obtained by performing the annealing process twice with the substrate heated from room temperature to 750° C. at an up rate of 10° C./s each time (corresponding to the fourth embodiment). As a result, we found that the resistivity of the p-type cladding layer 37 of p-type $Al_{0.07}Ga_{0.93}N$ was about 3.5 Ω·cm. We also measured the laser device characteristics of the light-emitting element obtained by performing the annealing process once with the substrate heated from room temperature to 750° C. at an up rate of 0.3° C./s (corresponding to the first embodiment). As a result, we found that the resistivity of the p-type cladding layer 37 of p-type $Al_{0.07}Ga_{0.93}N$ was about 5 Ω·cm.

Figure 9:
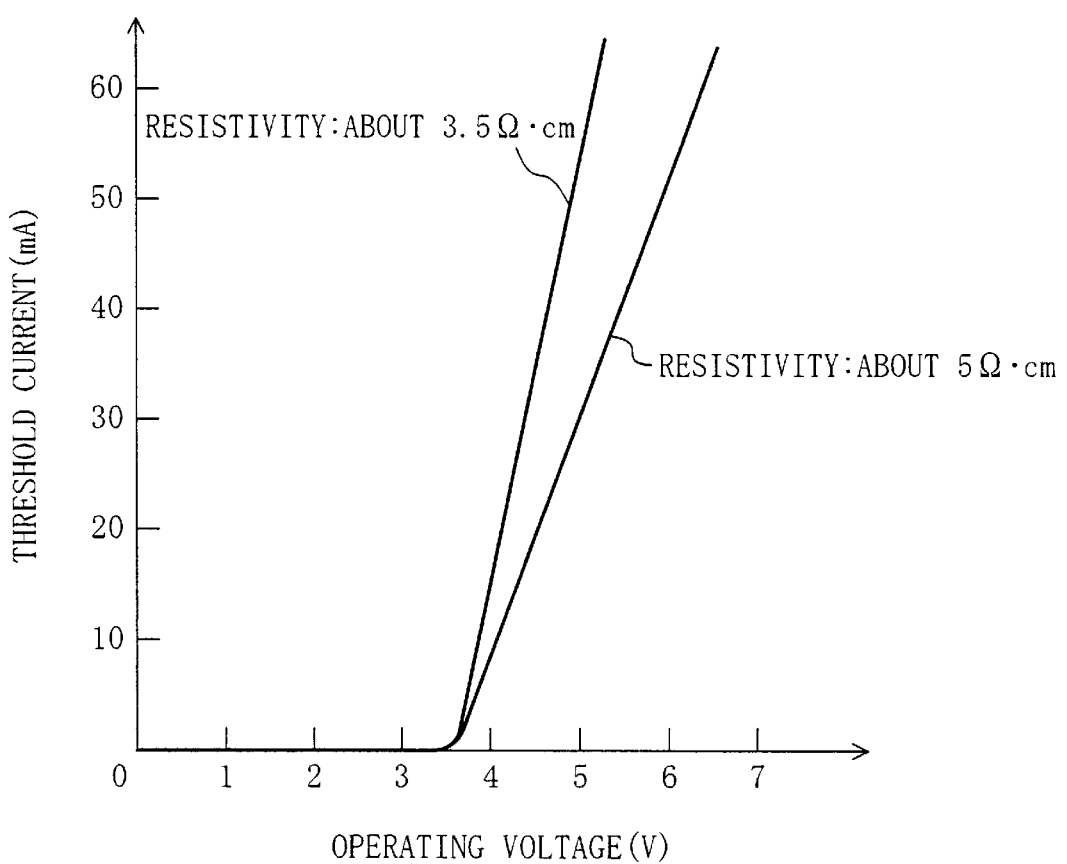
FIG. 9 is a graph showing relationships between the operating voltage and threshold current of the light-emitting element obtained by the semiconductor layer forming method according to the seventh embodiment.

FIG. 9 shows relationships between the operating voltage and threshold current of a light-emitting element where the resistivities of the p-type cladding layer 37 were about 3.5 Ω·cm and about 5 Ω·cm, respectively. As can be seen from FIG. 9, supposing the threshold current is constant, the operating voltage decreases while the resistivity of the p-type cladding layer 37 is low. For example, if the resistivity of the p-type cladding layer 37 is about 3.5 Ω·cm, the operating voltage is 5 V for a threshold current of 50 mA, and thus the power dissipation is about 0.25 W. On the other hand, if the resistivity of the p-type cladding layer 37 is about 5 Ω·cm, the operating voltage is 6 V for a threshold current of 60 mA, and thus the power dissipation is about 0.36 W.

These relationships show that if any of the semiconductor layer forming methods according to first through sixth embodiments is applied to the Group III–V compound semiconductor layers to which a p-type dopant has been introduced, the operating voltage of the resultant light-emitting element decreases, thus reducing the power dissipation. As a result, heat generated by the light-emitting element is suppressed, and the reliability thereof improves.

In the first through sixth embodiments, the sapphire substrate is used as a substrate. But a substrate of silicon carbide may also be used instead.

What is claimed is:

1. A method for forming a semiconductor layer, the method comprising the steps of:
   forming a Group III–V compound semiconductor layer, to which a p-type dopant has been introduced, over a substrate; and
   annealing the compound semiconductor layer,
   wherein the annealing step includes the step of eliminating atoms, deactivating the p-type dopant, from the compound semiconductor layer by relaxing an internal stress of the compound semiconductor layer in the stage of heating the compound semiconductor layer.

2. The method of claim 1, wherein the stage of heating the compound semiconductor layer includes the step of relaxing the internal stress of the compound semiconductor layer by adjusting an ambient pressure on the substrate.

3. The method of claim 2, wherein the stage of heating the compound semiconductor layer includes the step of setting the ambient pressure higher than the atmospheric pressure.

4. The method of claim 2, wherein the stage of heating the compound semiconductor layer includes the step of adjusting the ambient pressure when the substrate has a temperature of 500° C. or lower.

5. The method of claim 1, wherein the compound semiconductor layer contains nitrogen as a Group III element.

6. The method of claim 5, wherein the compound semiconductor layer is a cladding, contact, or light guide layer for a light-emitting element.

* * * * *